(12) United States Patent
Moriceau et al.

(10) Patent No.: US 8,877,539 B2
(45) Date of Patent: Nov. 4, 2014

(54) METHOD FOR PRODUCING A PHOTOVOLTAIC CELL INCLUDING THE PREPARATION OF THE SURFACE OF A CRYSTALLINE SILICON SUBSTRATE

(75) Inventors: Hubert Moriceau, Saint-Egreve (FR); Pierre Mur, Crolles (FR); Pierre-Jean Ribeyron, Saint Ismier (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/522,829

(22) PCT Filed: Jan. 26, 2011

(86) PCT No.: PCT/FR2011/000049
§ 371 (c)(1),
(2), (4) Date: Jul. 18, 2012

(87) PCT Pub. No.: WO2011/092401
PCT Pub. Date: Aug. 4, 2011

(65) Prior Publication Data
US 2012/0288985 A1    Nov. 15, 2012

(30) Foreign Application Priority Data
Jan. 27, 2010    (FR) ..................................... 10 00306

(51) Int. Cl.
*H01L 31/18* (2006.01)
*H01L 31/20* (2006.01)
*H01L 21/306* (2006.01)
*H01L 31/0236* (2006.01)
*H01L 31/075* (2012.01)

(52) U.S. Cl.
CPC ........ *H01L 21/30604* (2013.01); *H01L 31/202* (2013.01); *Y02E 10/548* (2013.01); *H01L 31/18* (2013.01); *H01L 31/02363* (2013.01); *H01L 31/075* (2013.01)
USPC ........................................................ 438/57

(58) Field of Classification Search
CPC ..... H01L 31/18; H01L 31/1876; H01L 31/04; H01L 31/042; H01L 31/06; H01L 31/068; H01L 31/072; H01L 31/1816; H01L 31/1824; H01L 31/20; H01L 31/0236; H01L 31/02363; H01L 31/075; H01L 21/30604; H01L 21/02019
USPC ........... 438/57, 689, 694, 706, 745, 753, 759, 438/765, 94, 769–774; 257/431, 461, 257/E21.001, E21.085, E21.211, E21.214, 257/257, E31.043, E31.047, E31.13
See application file for complete search history.

(56) References Cited

U.S. PATENT DOCUMENTS 4,818,337 A  *  4/1989  Barnett et al. ................. 136/256
5,693,578 A     12/1997  Nakanishi et al.
(Continued)

FOREIGN PATENT DOCUMENTS

JP    06021214 A  *  1/1994
JP    H-07-38111 A     2/1995
(Continued)

OTHER PUBLICATIONS

Yoo, Semiconductor Manufacturing Technology, vol. 13—Advanced Series in Electrical and Computer Engineering, Singapore: World Scientific Publishing Co., 2008: p. 63-68.*

(Continued)

*Primary Examiner* — Michele Fan
(74) *Attorney, Agent, or Firm* — Oliff PLC (57) ABSTRACT

A method for producing of at least one photovoltaic cell includes successively the anisotropic etching of a surface of a crystalline silicon substrate and the isotropic etching treatment of said surface. The isotropic etching treatment includes at least two successive operations respectively consisting in forming a silicon oxide thin film with a controlled average thickness, ranging between 10 nm and 500 nm and in removing said thin film thus-formed. The operation consisting in forming a silicon oxide thin film on the face of the substrate is carried out by a thermally activated dry oxidation. Such a method makes it possible to improve the surface quality of the surface of the substrate once said surface is etched in an anisotropic way.

28 Claims, 5 Drawing Sheets

(56) References Cited

U.S. PATENT DOCUMENTS

| | | | |
|---|---|---|---|
| 5,871,653 A * | 2/1999 | Ling | 216/2 |
| 6,320,238 B1 * | 11/2001 | Kizilyalli et al. | 257/410 |
| 6,624,049 B1 * | 9/2003 | Yamazaki | 438/476 |
| 2001/0029978 A1 | 10/2001 | Nakai et al. | |
| 2002/0104822 A1 | 8/2002 | Naydenkov et al. | |
| 2003/0207589 A1 * | 11/2003 | Li et al. | 438/763 |
| 2004/0082141 A1 * | 4/2004 | Mizukoshi | 438/424 |
| 2004/0259335 A1 * | 12/2004 | Narayanan et al. | 438/584 |
| 2007/0054468 A1 * | 3/2007 | Takamizawa et al. | 438/459 |
| 2007/0256728 A1 | 11/2007 | Cousins | |
| 2008/0083830 A1 | 4/2008 | Tokunaga et al. | |
| 2009/0215218 A1 * | 8/2009 | Meier et al. | 438/80 |
| 2010/0032012 A1 * | 2/2010 | Isaka et al. | 136/256 |
| 2012/0083127 A1 * | 4/2012 | Clark et al. | 438/703 |

FOREIGN PATENT DOCUMENTS

| | | |
|---|---|---|
| JP | H-07-66437 A | 3/1995 |
| JP | A-2000-235975 | 8/2000 |
| JP | B2-3271990 | 4/2002 |
| JP | A-2005-175023 | 6/2005 |
| JP | A-2005-524977 | 8/2005 |
| JP | A-2007-194485 | 8/2007 |
| JP | A-2008-300440 | 12/2008 |
| JP | A-2011-061030 | 3/2011 |
| WO | WO98/43304 | 10/1998 |
| WO | WO 03/094218 A2 | 11/2003 |
| WO | WO 2009/094578 A2 | 7/2009 |
| WO | WO 2009/120631 A2 | 10/2009 |

OTHER PUBLICATIONS

Cui et al., "Rapid thermal oxidation of silicon in ozone," *Journal of Applied Physics*, Jun. 1, 2000, pp. 8181-8186, vol. 87, No. 11, American Institute of Physics.

Kim et al., "Oxide growth on silicon (100) in the plasma phase of dry oxygen using an electron cyclotron resonance source," *J. Vac. Sci. Technol.*, Jul./Aug. 1996, pp. 2667-2673, vol. 14, No. 4, American Vacuum-Society.

Miki et al., "Selective Etching of Native Oxide by Dry Processing Using Ultra Clean Anhydrous Hydrogen Fluoride," Dec. 11, 1988, pp. 730-733, vol. 88.

Pena et al., "Hydrogen plasma etching of silicon dioxide in a hollow cathode system," *Thin Solid Films*, Sep. 4, 2009, pp. 3156-3159, vol. 518, No. 12, Elsevier B.V.

Edwards et al., "Effect of texturing and surface preparation on lifetime and cell performance in heterojunction silicon solar cells," *Solar Energy Materials and Solar Cells*, Nov. 1, 2008, pp. 1373-1377, vol. 92, No. 11, Elsevier B.V.

Kerr et al., "Surface recombination velocity of phosphorus-diffused silicon solar cell emitters passivated with plasma enhanced chemical vapor deposited silicon nitride and thermal silicon oxide," *Journal of Applied Physics*, Apr. 1, 2001, pp. 3821-3826, vol. 89, No. 7, American Institute of Physics.

Fesquet et al., "Modification of textured silicon wafer surface morphology for fabrication of heterojunction solar cell with open circuit voltage over 700 mV," *Photovoltaic Specialists Conference*, 34th IEEE, Jun. 7, 2009, pp. 754-758, Piscataway, NJ.

Sakoda et al., "Additional Plasma Surface Texturing for Single-Crystalline Silicon Solar Cells Using Dielectric Barrier Discharge," *Japanese Journal of Applied Physics*, Apr. 8, 2005, pp. 1730 and 1731, vol. 44, No. 4A, The Japan Society of Applied Physics.

Sritharathinkhun et al., Japanese Journal of Applied Physics, 47, 11, 2008, 8452-8455.

Huran et al., ACTA Phys. Slov 39, 1990, No. 2.

\* cited by examiner

METHOD FOR PRODUCING A PHOTOVOLTAIC CELL INCLUDING THE PREPARATION OF THE SURFACE OF A CRYSTALLINE SILICON SUBSTRATE

TECHNICAL FIELD OF THE INVENTION

The invention relates to a method for producing at least one photovoltaic cell including the following successive steps:
anisotropically etching a surface of a crystalline silicon substrate
and an isotropic etching treatment of said surface, said treatment including forming a silicon oxide and removing said silicon oxide.

STATE OF THE ART

A photovoltaic cell is made of a multi-layer stack making it possible to directly convert the photons received into an electric signal.

For example, such a photovoltaic cell can be a photovoltaic heterojunction cell. The heterojunction is in particular formed by a crystalline silicon substrate with a given type of doping (n or p) and by an amorphous silicon layer of a type opposite that of the substrate. Moreover, an intermediate layer, called "passivation" layer, is generally arranged between the two elements forming the heterojunction, in order to improve the interface characteristics of the heterojunction and thus the effectiveness of the conversion. As indicated in the patent application US2001/0029978, this intermediate layer is in general a layer of intrinsic amorphous silicon.

Figure 1:
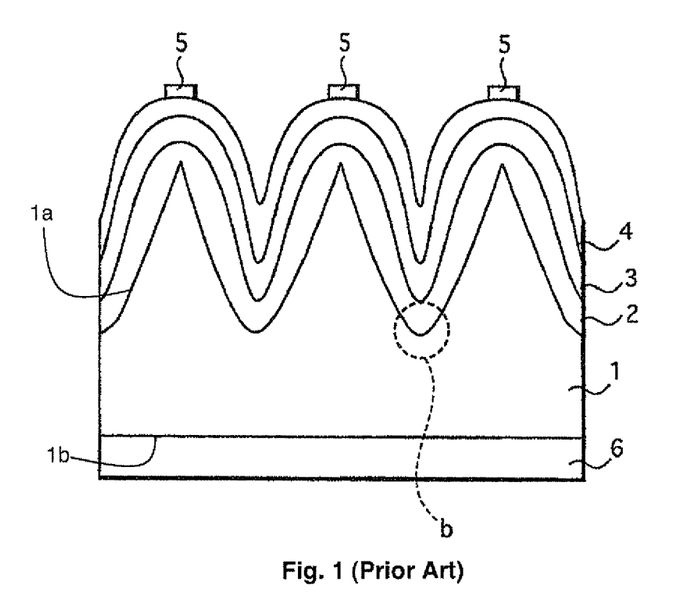
FIGS. 1 and 2 represent respectively, in schematic and sectional views, first and second embodiments of a photovoltaic cell according to the anterior art.

As an example, FIG. 1 illustrates a particular embodiment of a photovoltaic heterojunction cell according to the anterior art, as described in the patent application US2001/0029978. The photovoltaic heterojunction cell comprises a crystalline silicon substrate 1, for example n-doped and including a front face 1a, uniformly and successively covered by:
a layer 2 of intrinsic amorphous silicon,
a layer 3 of amorphous silicon, for example a p-doped one to form the heterojunction with the substrate 1,
an electrode 4, for example made of indium tin oxide (or ITO)
and a current collector 5, for example in the form of a comb.

Moreover, the front face 1a of the substrate 1 is textured (or structured) in order to increase the optical confinement of the cell.

Figure 2:
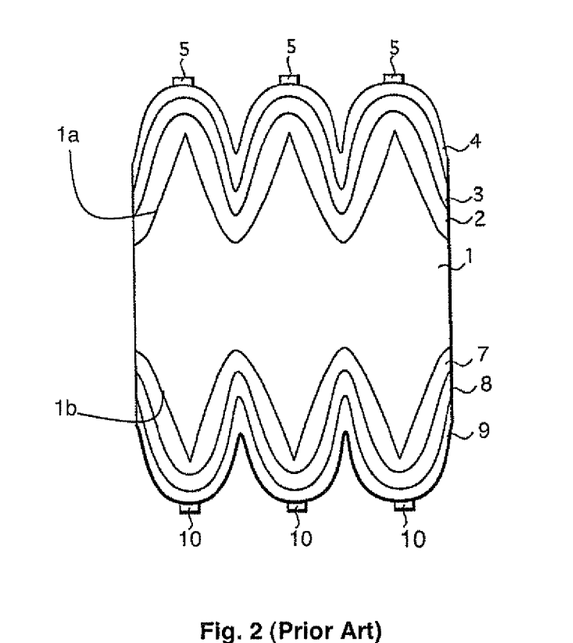

In FIG. 1, the back face 1b of the substrate 1 is flat and covered with an electrode 6. However, in other cases, it can be textured and covered with a multi-layer stack as represented in FIG. 2. Thus, in this embodiment, the back face 1b of the substrate 1 is uniformly and successively covered by:
a layer 7 of intrinsic amorphous silicon,
a layer 8 of amorphous silicon, very strongly doped, for example n-doped,
an electrode 9, for example made of ITO
and a current collector 10 having the form of a comb.

Thus, photovoltaic cells, such as photovoltaic heterojunction cells as illustrated in FIGS. 1 and 2, require a uniform deposition of a plurality of very fine layers (from about some nanometers to a few tens of nanometers) onto a substrate whose at least one face is textured. By uniform deposition, also called conform deposition, of a thin layer, it is understood the deposition of a thin layer with a substantially constant thickness, in order to follow the relief of the face on which the thin layer is deposited.

However, the step of texturing the substrate on at least one face does not facilitate the good conformation (or uniform distribution) of these layers.

Moreover, in the field of photovoltaic cells, it is common to texture at least one face of the substrate in the form of pyramids as represented in FIGS. 1 and 2. However, the sides of the pyramids obtained are often very rough and the summits and valleys of the pyramids are abrupt (radius of curvature <30 nm), which is detrimental to a perfect conformation of the layers successively deposited on the textured face.

In general, texturing is advantageously carried out by at least one step of anisotropic etching using an alkaline solution, such as potassium hydroxide (KOH) or sodium hydroxide (NaOH). It was also proposed to add an active interface agent, such as isopropanol (IPA), to the alkaline solution in order to limit the roughness phenomenon.

As an example, in the patent application US2001/0029978, the substrate 1 is textured by cleaning its surface then by plunging the cleaned substrate into an alkaline solution, such as NaOH, to which isopropanol (IPA) is possibly added in order to carry out said anisotropic etching.

To avoid certain problems due to anisotropic etching, the patent application US2001/0029978 also proposes to carry out after the step of anisotropic etching a step of rounding off the zones between two pyramids (zones "b" in FIG. 1) formed during the step of anisotropic etching. For that, the substrate is subjected to a series of steps of cleaning, before being subjected to a step of isotropic etching, by immersion in an aqueous solution containing hydrofluoric acid (HF) and nitric acid ($HNO_3$), at a ratio of 1:20, for approximately 30 seconds. Then, the substrate is subjected to steps of cleaning (deionized water also noted water DI, then HF+water, then water DI). Thus, the step of isotropic etching with the mixture of HF and $HNO_3$ allows, in a known way, to form a silicon oxide thanks to the oxidizing action of nitric acid and to eliminate by an etching process said silicon oxide thanks to the attack action by hydrofluoric acid. According to an alternative mentioned in patent application US2001/0029978, the aqueous mixture can also contain $CH_3COOH$.

Wet isotropic etching proposed in the patent application US2001/0029978 is however too important (about 2 μm or more). It does not thus make it possible to obtain a smoothing of the sides of the pyramids on the nanometric level, nor to round off the summits of the pyramids.

In the patent application US2001/0029978, it is also proposed to replace wet isotropic etching with HF and $HNO_3$ by a dry etching using a gas couple $CF_3/O_2$. However, such an etching operation damages the so-treated surface quality by generating a crystalline disturbance on the surface, even in the subsurface, which can cause problems of passivation.

In the patent application WO-A-2009/120631, manufacturing of photovoltaic cells includes a step of surface texturing to form patterns having for example the form of pyramids. Moreover, the method described in the patent application WO-A-2009/120631 can also comprise a step of post-cleaning carried out by a surface oxidation operation, followed by an etching operation. The oxidation operation is chemically carried out by immersion into a liquid solution such as a deionized water bath containing between 1 ppm and 30 ppm of ozone, with possibly 1% vol of HCl. This chemical oxidation operation then generates a very fine oxide, whose thickness is not homogeneous on the textured surface to be treated. The removal by etching of such an oxide is sufficient to clean the surface, but remains insufficient to smooth the texture, the object of which is to round off or soften the texture angles. This is why in the patent application WO-A-2009/12631, a specific step of smoothing is in particular carried out before this step of post-cleaning, when it is desired to round off or soften the angles of the texture obtained. As in the patent application US2001/0029978, this possible step of smoothing is carried out by a wet process, with the above-detailed disadvantages.

OBJECT OF THE INVENTION

The object of the invention is to propose, for a method for producing at least one photovoltaic cell, an isotropic etching treatment making it possible to improve the quality of the surface of the crystalline silicon substrate, once said surface has been anisotropically etched, compared to the isotropic etching treatments proposed in the anterior art. In particular, for a substrate surface textured in the form of pyramids, the object of the invention is to round off the summits and zones between two pyramids as well as to smooth the sides of said pyramids.

According to the invention, this object is reached by a method for producing at least one photovoltaic cell including the following successive steps:

anisotropically etching a surface of a crystalline silicon substrate and an isotropic etching treatment of said surface, said treatment including forming a silicon oxide and removing said silicon oxide, characterized in that the isotropic etching treatment of said surface includes two successive operations, respectively consisting in forming by thermally activated dry oxidation on said surface of the substrate a thin film of silicon oxide with a thickness between 2 nm and 500 nm and in removing said thin film of silicon oxide.

According to a development of the invention, the two successive operations constitute an operational cycle repeated at least once during the isotropic etching treatment.

SUMMARY DESCRIPTION OF THE DRAWINGS

Other advantages and characteristics will more clearly arise from the following description of particular embodiments of the invention given as nonrestrictive examples and represented in the annexed drawings in which.

DESCRIPTION OF PARTICULAR MODES OF REALIZATION

The various steps of a particular embodiment of at least one photovoltaic cell, such as a photovoltaic heterojunction cell, are illustrated in FIGS. 3 to 9.

Figure 3:
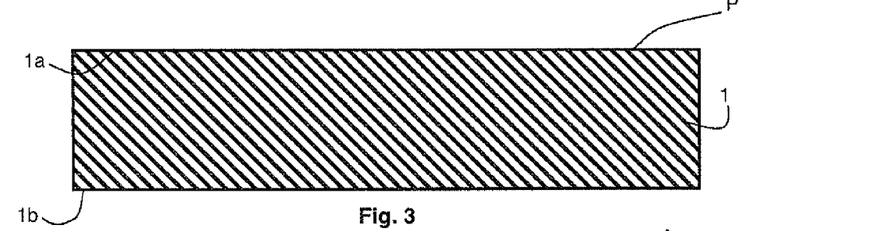
FIGS. 3 to 9 illustrate different steps of a particular method for manufacturing at least one photovoltaic cell according to the invention.
Figure 4:
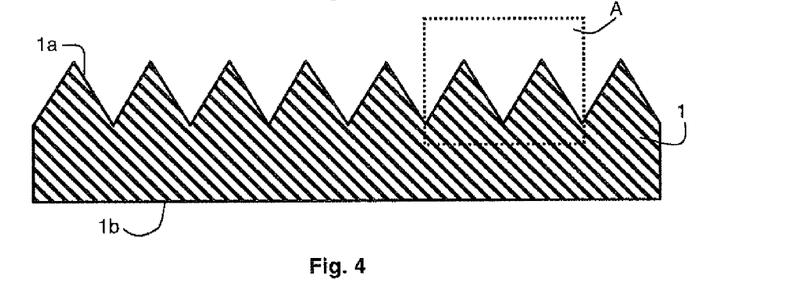
Figure 5:
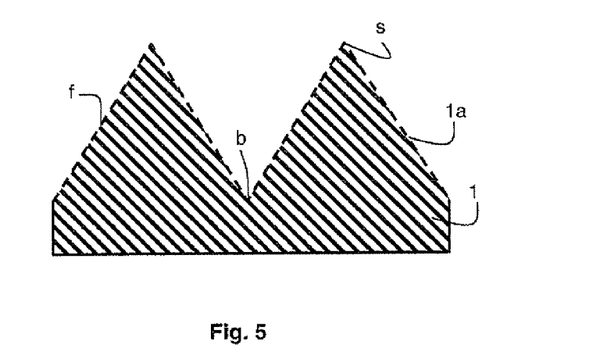

The substantially flat front face $1a$ of a crystalline silicon substrate 1, for example n-doped, is initially subjected to an anisotropically etching operation, In particular, in FIGS. 3 and 4, the anisotropically etching of the front face $1a$ of the substrate 1 makes it possible to structure (or texture) the front face $1a$ in the form of pyramids. It is carried out for example by immersing the face $1a$ of the substrate 1 into an aqueous anisotropic-etching solution, containing potassium hydroxide (KOH) and isopropanol (IPA), for 30 minutes and at a temperature of 80° C. Moreover, when only the front face $1a$ of the substrate 1 is structured as represented in FIGS. 3 and 4, the back face $1b$ can be covered with a protection mask (for example of $SiO_2$ or $Si_3N_4$), resistant to the anisotropically etching with the aqueous KOH-containing solution in order to protect said back face $1b$.

For a silicon substrate having a crystallographic axis (100) oriented perpendicular to its surface, the sides "f" of the obtained pyramids form, in general, an angle of 54.7° with the main plane "P" of the face $1a$, i.e. the plane of the face $1a$ before said face is textured. Moreover, the widths of the pyramids range between 0.1 μm and 40 μm and advantageously between 1 μm and 30 μm, according to the concentration of the aqueous solution and the etching time.

As illustrated by the magnification A of a part of the front face $1a$ of the substrate 1, the surface quality of said face $1a$ after the anisotropic etching operation and, in particular, the sides "f" of the pyramids are rough (which is schematically represented by the dotted lines in FIG. 5) and the summits "s" of the pyramids, just like the zones "b" between two pyramids, are abrupt (in particular with a radius of curvature lower than 30 nm).

In order to improve the surface quality of the face $1a$ after the anisotropic etching operation and in particular to smooth the sides "f" of the pyramids advantageously created and to round off the zones called "b" between two pyramids and the summits "s" of said pyramids, it is proposed to carry out an isotropic etching treatment including at least two successive operations respectively consisting in forming a thin film of silicon oxide having a controlled thickness and in removing said thin film thus formed, preferably in a homogeneous way. Moreover, the thickness of the thin film of silicon oxide is comprised between 2 nm and 500 nm and it is preferentially homogeneous on at least the sides "f" of the pyramids and advantageously on all the treated surface.

The formation of a thin film of silicon oxide on the face $1a$ of the substrate 1 is carried out by a thermally activated dry oxidation operation, i.e. by oxidizing the face of the substrate by means of a not-liquid oxidizing agent while maintaining said face at a temperature higher than the ambient temperature. The oxidizing agent can be in particular in a gaseous form or be contained in a plasma. It can be for example oxygen, ozone, water, alone or in mixture. More particularly, the thermal activation of the dry oxidation consists in providing energy to the face of the substrate, by applying a thermal budget defined by at least one temperature higher than the ambient temperature and advantageously higher than or equal to 40° C. Moreover, such a thermal budget is advantageously adapted to make it possible to obtain a compromise between a fast and sufficiently high rise in temperature to generate the thin film of silicon oxide and a final temperature which is not too high in order to avoid a deterioration of the surface or volume properties of the silicon substrate.

Indeed, forming a thin film of silicon oxide with a particular and controlled thickness and then removing it makes it possible:

to strongly decrease the surface roughness of the textured face of the substrate and thus to ensure a minimum level of energy state density at the interface with the thin layer intended to be directly deposited onto said substrate face, and to round off the angles of the structures (summits "s" and zones "b" of the pyramids), which makes it possible to obtain a better conformation of the thin layers deposited later.

Moreover, the treatment also makes it possible to eliminate most of the particulate contaminations, which are particularly critical on textured silicon substrates.

More particularly, the isotropic etching treatment can be carried out in various manners.

In particular, the thermally activated dry oxidation operation can be a thermal oxidation, i.e. an oxidation by means of at least one oxidizing agent in a gaseous form or contained in a plasma and by applying to the face of the substrate a temperature higher than the ambient temperature and advantageously higher than or equal to 40° C. In particular, the applied temperature is lower than 1100° C. More particularly, such an operation is carried out by a fast treatment process, also called "Rapid Thermal Process" or "RTP", in order to obtain an isotropic oxidation. Thus, the dry oxidation operation is preferably carried out with a very fast rise in temperature (for example between 100° C./s and 200° C./s). On the other hand, the final temperature obtained at the end of this rise in temperature is preferably moderate in order to avoid a damage of the treated surface quality and of the volume properties of the substrate.

The thermally activated dry oxidation operation can also be assisted or it can be obtained by applying ultraviolet radiations with wavelengths ranging from 0.15 μm to 0.4 μm and advantageously of approximately 254 nm and approximately 185 nm. In the same way, it can also be assisted or obtained by a plasma treatment, activated for example by radiofrequencies, microwaves or ultra high frequencies. Plasma can be for example a plasma, such as an inductive plasma or a reactive ion etching (RIE) plasma. The oxidizing agent can be a gas or a mixture of gases which can contain oxygen, ozone, water vapor or it can be another oxidizing gaseous species, alone or in combination, in a molecular, ionic, radical-like or atomic form. The total pressure during the oxidation operation can be of any type: it can be atmospheric, sub-atmospheric or super-atmospheric. It is also possible to vary the partial pressure(s) of each species constituting the oxidizing agent according to the total pressure. In particular, the partial pressure(s) of each species could be adjusted according to the desired speed of oxidation.

According to a first example, the oxidation operation can be a thermal oxidation carried out at a temperature of about 400° C., with a gas mixture of oxygen and ozone (in particular from 3 to 4% of $O_3$ relative to $O_2$). Such an operation makes it possible to obtain a thin film of silicon oxide with a sufficient thickness to improve the surface quality, once said film is removed. One will advantageously choose a thickness higher than 10 nm, which can be obtained for example at a temperature of 450° C. during 3 hours. Greater thicknesses can be obtained by increasing the temperature and/or the processing time. For example, one can obtain a 25 nm film of silicon oxide at a temperature of 550° C. for 4 hours. In order to increase the thickness of the silicon oxide film generated during the operation of isotropic etching treatment, one also can reiterate an operational cycle formed of the successive oxidation and removal operations, as that will be detailed later. The thickness of the silicon oxide is multiplied by four compared to a film obtained by oxidation with oxygen only at the same temperature.

According to a second example, the oxidation operation can be a thermal oxidation carried out between 700° C. and 800° C., assisted by a UV radiation in a gas mixture of oxygen and ozone (approximately 2 ppm of $O_3$ relative to $O_2$). Such an operation makes it possible to obtain a thin film of silicon oxide with a sufficient thickness to improve the surface quality, once said film is removed. The thickness of the silicon oxide is increased by 50% to 100% compared to a film obtained by oxidation with oxygen only. The thickness of the film of silicon oxide generated will advantageously be selected so as to be higher than 10 nm. For example, with an oxidation at 800° C. for 140 min, one obtains a film of silicon oxide with a thickness of about 25 nm. For the same duration, one obtains a film with a thickness of 60 nm, at 900° C. and of 5 nm at 700° C. The thickness of the silicon oxide generated during the operation of isotropic etching treatment can also be increased by an operational cycle formed of the oxidation and removal operations, as that will be detailed later.

According to a third example, the oxidation operation can be an oxidation obtained by a plasma treatment activated by microwaves (2.45 GHz) and assisted by DC-magnetron polarization (100 V) and with an oxygen partial pressure of approximately 100 mT. In this case, the formed oxide thin film has a thickness of about 400 nm for an oxidation duration of one hour, on a surface of a silicon plate whose surface temperature is maintained at approximately 600° C.

The operation of removing the thin film of silicon oxide, directly following the oxidation operation, can be carried out by a dry method, for example by a reactive ion etching (RIE) or by a wet method, for example by immersing the face 1a of the substrate 1 into a liquid solution containing hydrochloric acid (HCl) and hydrofluoric acid (HF), possibly buffered (BHF). The removal operation can also be carried out by a treatment in a reducing medium, for example by carrying out a heat treatment under hydrogen atmosphere. These examples of removal steps are known to be homogeneous removal steps, i.e. a removal at a constant speed of removal on under the surface, in spite of the texture.

Moreover, advantageously, the two successive operations constitute an operational cycle which can be repeated at least once. Such a repetition can be advantageous in particular when the formed thin film of silicon oxide has a thickness of about 2 nm. The repetition of the two successive operations of oxidizing and removing the thin film of silicon oxide makes it possible to optimize the method and in particular to save time.

In addition, in this embodiment, the total (or cumulated) thickness of silicon oxide formed during the isotropic etching treatment is advantageously higher than 10 nm and, preferably, higher than 20 nm. By total thickness of silicon oxide, it is understood in this embodiment the sum of the thicknesses of thin films of silicon oxide successively formed during the treatment, which more precisely corresponds to the thickness of a film of silicon oxide formed by the totality of the various successive oxidation operations on the assumption that they would not be interrupted with removal operations.

If the operational cycle does not need to be repeated, the thickness of the thin film of silicon oxide formed during the single thermally activated dry oxidation operation of the treatment is also, in an advantageous way, higher than 10 nm and, preferably, higher than 20 nm. One will speak, by analogy, also in this case, of total thickness of silicon oxide formed during the isotropic etching treatment.

Carrying-out one or more operational cycles involves a very small etching of silicon, by smoothing the sides of the pyramids and by modifying not only the geometry of the summits of the pyramids but also that of the zones between the pyramids, while maintaining the optical containment of the texture on a very good level.

Figure 6:
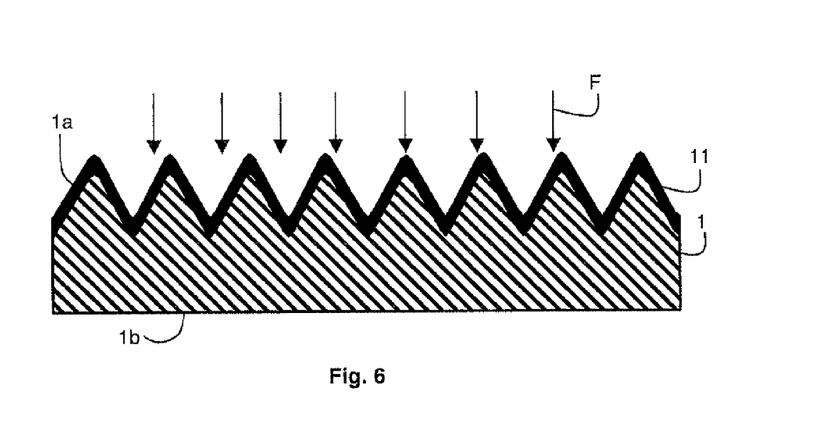
Figure 7:
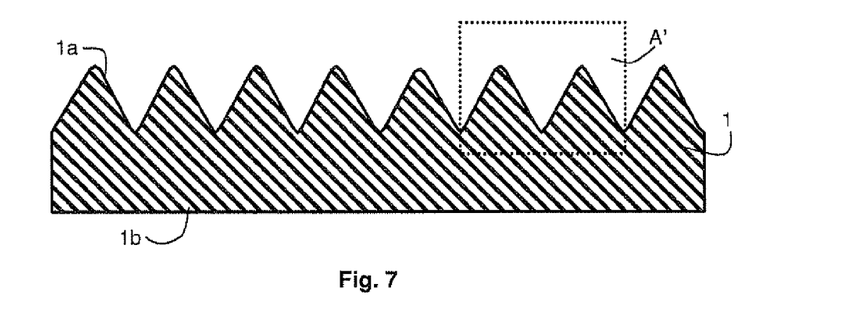
Figure 8:
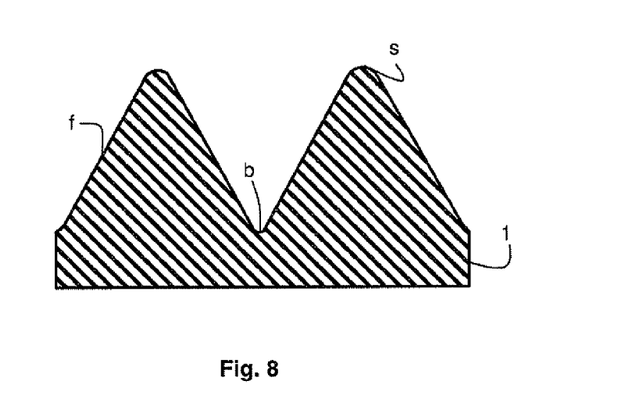

The isotropic etching treatment of the face 1a of the substrate 1 is illustrated, for example, in FIGS. 6 to 8. The arrows F in FIG. 6 represent the thermally activated dry oxidation operation forming the silicon oxide thin film 11, on the face 1a of the substrate 1 and allowing the rounding-off of the summits "s" of the pyramids and the valley zones "b" between the pyramids. Once the operation is completed, the silicon oxide thin film 11 is removed (FIG. 7). The magnification A' represented in FIG. 8 illustrates such a rounding-off of the summits "s" of the pyramids and the valley zones "b" between the pyramids as well as the smoothing of the sides "f" (in full lines in FIG. 8), once the thin film 11 is removed.

Figure 9:
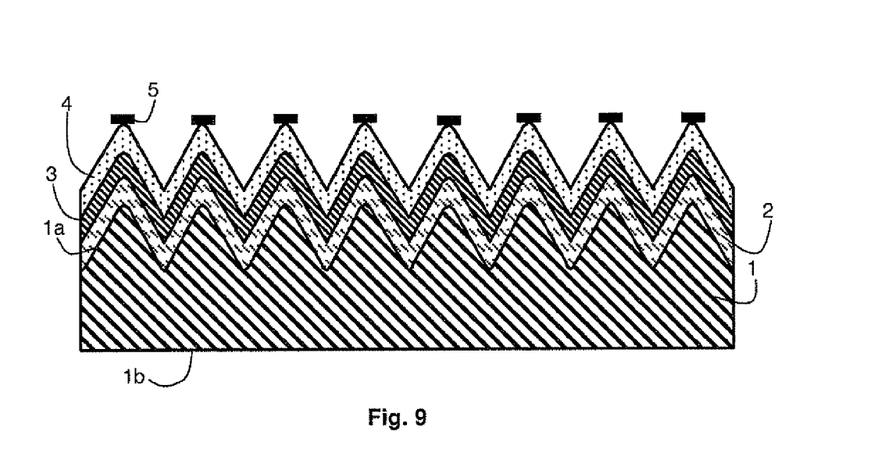

Then, as illustrated in FIG. 9, the isotropic etching operation can be followed by the formation, on said surface, of a multi-layer stack including successively:

a thin layer of intrinsic amorphous silicon 2 forming, in FIG. 9, a passivation layer, a thin layer of amorphous silicon 3 having a doping type opposite to the doping type of the crystalline silicon substrate, an electrode 4, and a current collector 5.

Moreover, the front face 1a of the crystalline silicon substrate 1 can be subjected, after the isotropic etching treatment and before the formation of a multi-layer stack, to at least one step of cleaning and one step of drying. Thus, as an example, the face 1a of the substrate 1 can be subjected to a treatment with a mixture of hydrofluoric acid and hydrochloric acid (HF/HCl), with a low HF content, in order to avoid a new contamination of the surface. The cleaning treatment can also be carried out with hydrofluoric acid (HF) vapor, followed by a rinsing process with a mixture of deaerated water without free oxygen and of HCl to avoid any pollution of the surface by oxygen. This pollution would involve the premature formation of a native oxide detrimental to good passivations of the surface. Moreover, a drying operation can follow in order to avoid any contaminating deposition onto the pyramids. It is, for example, carried out with vaporized isopropanol (IPA) or in a liquid with a weak surface tension or by immersion into a liquid solution such as deaerated water followed by an immersion into a solution of IPA, preferably heated. Advantageously, the formation of the multi-layer stack, for example by plasma enhanced chemical vapor deposition (PECVD), can then be carried out up to half an hour after the drying process, without reduction of the output of the obtained photovoltaic cells.

As in the embodiments represented in FIGS. 1 and 2, the back face 1b of the substrate 1 can be advantageously covered by at least one thin layer. It can be covered, for example, by an electrode 6 such as that represented in FIG. 1 or by a multi-layer stack such as that represented in FIG. 2.

Moreover, the invention is not limited to the embodiments described above, in particular with regard to the doping type of the substrate 1 and the layers 3 and 8 of amorphous silicon. Consequently, the invention is not limited to the embodiments including a substrate of n-doped crystalline silicon and layers 3 and 8 of amorphous silicon, respectively p- and n-doped. The layer of amorphous silicon 3 has a doping type opposite to that of the substrate 1, in order to form the heterojunction of the photovoltaic cell and the layer 8 of amorphous silicon on the side of the back face 1b of the substrate 1 has, in particular, a doping type identical to that of the substrate 1. In addition, instead of being made of amorphous silicon, the thin layers 3 and 8 can also be made of microcrystalline silicon.

In the same way, the above-described embodiments illustrate an anisotropic etching and an isotropic etching treatment of the front face 1a of the substrate 1. However, these etchings could be used not on the front face 1a of the substrate 1, but on its back face 1b or even, in addition to the front face 1a of the substrate 1, on the back face 1b of the substrate 1. In this case, the thin layer of amorphous or microcrystalline silicon 8 of the multi-layer stack on the back face 1b has a doping type identical to that of the crystalline silicon substrate 1.

In addition, according to an embodiment alternative, a step of depositing a layer of a material with a nature and/or a crystalline structure and/or a morphology different to that of the substrate 1 can be carried out between the step of anisotropic etching and the isotropic etching treatment. Such a layer can be formed by amorphous silicon or polycrystalline silicon or by silicon oxide or an oxide with high permittivity (High K) such as $HfO_2$ or $Al_2O_3$ or $ZrO_2$. It can be deposited, for example, by a technique of chemical vapor deposition (CVD), at an appropriate temperature (for example from 100° C. to 800° C.).

Figure 10:
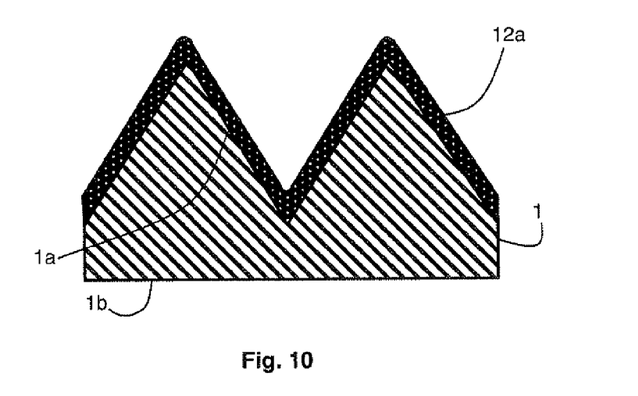
FIGS. 10 to 15 illustrate embodiment alternatives according to the invention.
Figure 11:
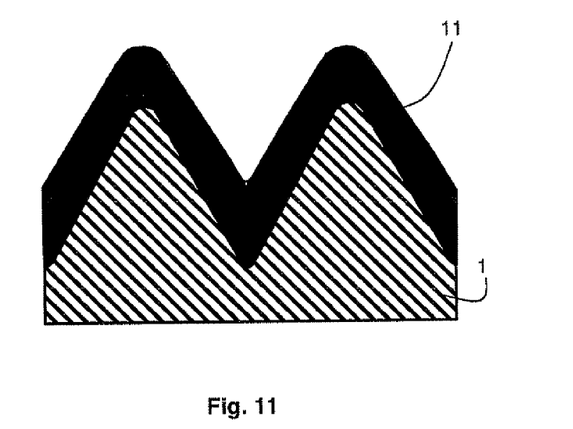
Figure 12:
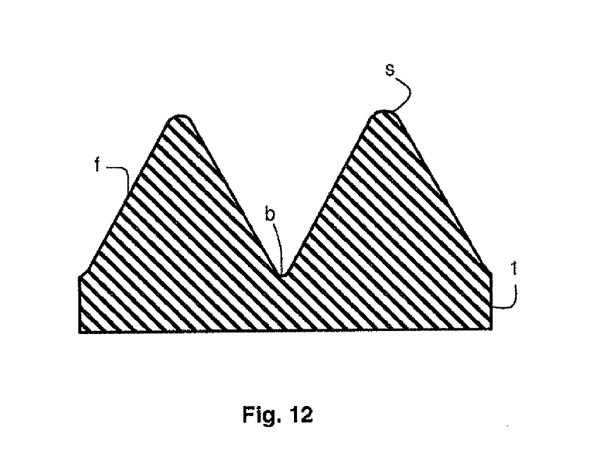

Thus, an as example, in FIGS. 10 to 12, a layer 12a formed by amorphous or polycrystalline silicon is deposited onto the front face 1a of the substrate 1 between the step of anisotropic etching and the isotropic etching treatment. In this case, the thermally activated dry oxidation operation makes it possible to oxidize the silicon of the layer 12a at the same time as the face of the substrate 1a on which said layer 12 is deposited, in order to form a silicon oxide thin film 11.

Figure 13:
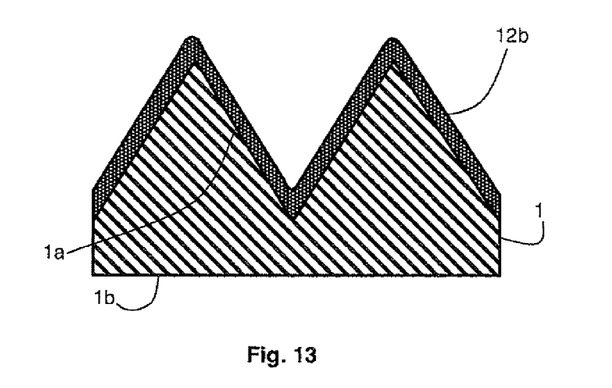
Figure 14:
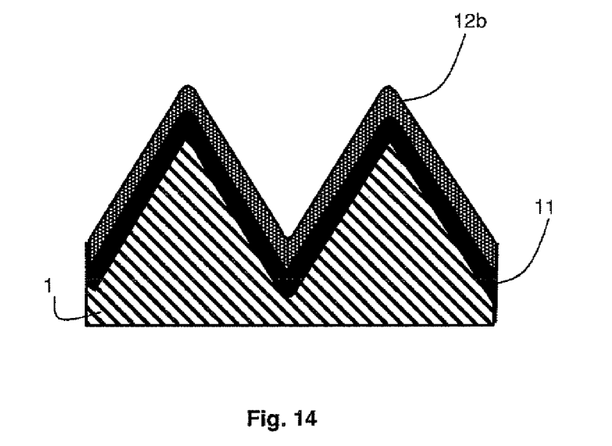
Figure 15:
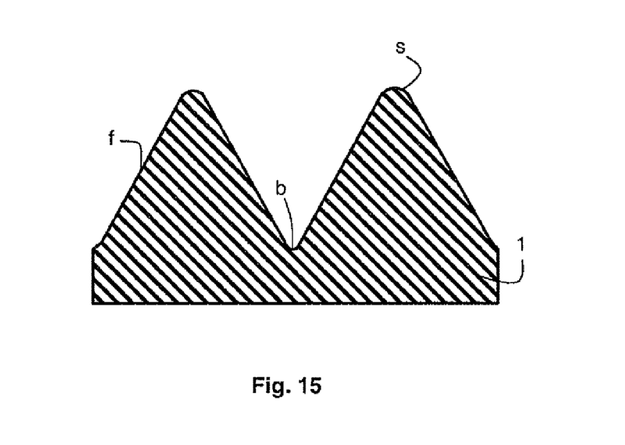

In FIGS. 13 to 15, a layer 12b formed by silicon oxide is deposited onto the front face 1a of the substrate 1, once said face is textured. In this case, the thermally activated dry oxidation operation makes it possible to oxidize, through the layer 12b, the front face of the substrate 1, in order to form between the substrate 1 and the layer 12b a silicon oxide thin film 11.

In all the cases and as illustrated in FIGS. 12 and 15, the layer 12a or 12b is removed during the operation of removing the silicon oxide thin film 11. Moreover, this layer 12a or 12b must be sufficiently thick, for example about the hundred or so nanometers. It is intended to support the improvement of the surface quality of the surface treated by isotropic etching. In particular, it is formed, during the deposition of this layer, a rounding-off at the summit "s" of the pyramids and in the zones "b" between the pyramids. Thus, it is possible to differentiate the oxidation of the sides "f" from the oxidation of the zones "b" and the summits "s" relative to the sides "f" of the pyramids, which improves the smoothing of the sides "f" and the rounding-off of the zones "b" and the summits "s".

As an example, a substrate initially having a crystallographic axis <100> oriented perpendicular to its surface is textured in order to have, on the surface, pyramids with summits "s" and valleys "b" between the pyramids, each of them having an average radius of curvature typically of 30 nm. It can be a substrate. A layer 12a of silicon, with a thickness of about 100 nm, is deposited by LPCVD onto said surface, in a range of temperatures from 500 to 620° C. The silicon thus deposited is then amorphous or polycrystalline. Moreover, according to the need, this layer 12a can be doped. It should be noted that, after the deposition of the layer 12a, the summits "s" and the valleys "b" formed by the layer 12a are rounded off. This rounding-off makes it possible to obtain a radius of curvature of about 200 nm in line with the valleys of the pyramids. Moreover, it is possible to adjust the thickness of the layer 12a according to the desired radius of curvature, according to the user's needs. This layer is then thermally oxidized to consume all its thickness for example by oxidation at 950° C. under steam ("steam" mode). During the oxidation, the presence of the rounding-off on the surface of the layer 12a of silicon then induces a rounding-off on the surface of the initial silicon substrate, at the summits and valleys of the pyramids with a radius of curvature of about 200 to 300 nm in line with the valleys between the pyramids. After the oxide removal, this rounded form is maintained.

According to another embodiment alternative, the passivation layer formed by the thin layer of intrinsic amorphous silicon 2 in FIG. 9 can be formed at least by a thin layer of crystalline silicon oxide directly deposited onto the surface of the substrate treated beforehand by isotropic etching. Such a thin layer of crystalline silicon oxide is advantageously obtained by radical surface oxidation of the surface of the substrate (1), for example by means of oxygenated radicals obtained from oxygen and/or from ozone and/or water, and it is not removed. It has advantageously a thickness lower than or equal to 2 nm and it can be covered with amorphous silicon oxide. As an example, the oxidation of a surface part of the substrate 1 can be carried out from oxygen and ultraviolet radiations in a wavelength range between 160 nm and 400 nm. The wavelengths of the ultraviolet radiations used are, for example, of approximately 185 nm and approximately 254 nm. In this particular embodiment, oxygen dissociates, under the action of the ultraviolet radiations, into free radicals O and ozone and said free radicals oxidize the surface of silicon and form at least the thin layer of crystalline silicon oxide.

Moreover, in another embodiment alternative, the passivation layer can be formed by the thin layer of crystalline silicon oxide and by the thin layer of intrinsic amorphous silicon, said thin layer being deposited between the thin layer of crystalline silicon oxide and the thin layer of amorphous or microcrystalline silicon.

Finally the above-described embodiments relate to a photovoltaic heterojunction cell. However, the isotropic etching treatment exposed in these various embodiments can be applied to a surface of a crystalline silicon substrate subjected beforehand to a step of anisotropic etching in order to make any type of photovoltaic cells and more particularly to make photovoltaic homojunction cells.

The invention claimed is:

1. A method for producing at least one photovoltaic cell, comprising successively:
   anisotropically etching a surface of a crystalline silicon substrate to form angles of said surface;
   performing an isotropic etching treatment of said surface of the crystalline silicon substrate, said isotropic etching treatment including two successive operations, consisting of (i) forming by a thermally activated dry oxidation, on said surface of the crystalline silicon substrate, a silicon oxide thin film with a uniform thickness ranging between 2 nm and 500 nm, and (ii) entirely removing said silicon oxide thin film, wherein said two successive operations constitute one cycle and said cycle is repeated at least once to round off said angles of said surface; and
   forming the photovoltaic cell on said surface of the crystalline silicon substrate.

2. The method according to claim 1, wherein the forming of the silicon oxide thin film by the thermally activated dry oxidation operation includes a treatment selected from the group consisting of:
   applying to said surface of the crystalline silicon substrate a temperature higher than the ambient temperature and using an oxidizing agent in a gaseous form or contained in a plasma;
   applying to said surface of the crystalline silicon substrate an ultraviolet radiation; and
   treating said surface of the crystalline silicon substrate with a plasma treatment activated by microwaves, radio-frequencies, or ultra-high frequencies.

3. The method according to claim 1, wherein the operation of removing said silicon oxide thin film is carried out by a method selected from the group consisting of a dry method, a wet method, and a method comprising a treatment in a reducing medium.

4. The method according to claim 1, wherein the silicon oxide thin film formed during the isotropic etching treatment has a total thickness ranging between 10 nm and 500 nm.

5. The method according to claim 1, wherein forming the photovoltaic cell comprises at least partly covering said surface of the crystalline silicon substrate with a multi-layer stack, said stack including, in succession:
   a passivation layer;
   a thin layer of amorphous or microcrystalline silicon with a predetermined doping type;
   an electrode; and
   and a current collector.

6. The method according to claim 5, wherein the doping type of the thin layer of amorphous or microcrystalline silicon is opposite to the doping type of the crystalline silicon substrate.

7. The method according to claim 5, wherein the doping type of the thin layer of amorphous or microcrystalline silicon is identical to the doping type of the crystalline silicon substrate.

8. The method according to claim 5, wherein the passivation layer is formed by at least one thin layer of intrinsic amorphous silicon.

9. A method for producing at least one photovoltaic cell, comprising successively:
   anisotropically etching a surface of a crystalline silicon substrate;
   depositing on said surface of the crystalline silicon substrate an intermediate layer formed of a material with a nature and/or crystalline structure and/or a morphology different from that of the crystalline silicon substrate, said intermediate layer having a substantially uniform thickness; and then
   performing an isotropic etching treatment of said surface of the crystalline silicon substrate, said isotropic etching treatment including two successive operations, consisting of (i) forming by a thermally activated dry oxidation, on said surface of the crystalline silicon substrate, a silicon oxide thin film with a thickness ranging between 2 nm and 500 nm, and (ii) removing said silicon oxide thin film, wherein the operation of removing the silicon oxide thin film removes the intermediate layer deposited on said surface of the crystalline silicon substrate; and
   forming the photovoltaic cell on said surface of the crystalline silicon substrate.

10. The method according to claim 9, wherein the material of the intermediate layer deposited on said surface of the crystalline silicon substrate is at least one member selected from the group consisting of amorphous silicon, polycrystalline silicon, silicon oxide, and high-permittivity oxide.

11. The method according to claim 9, wherein the operation of removing said silicon oxide thin film results in smoothing of the surface of the crystalline silicon substrate and/or rounding off of peaks and valleys of pyramids formed on the surface of the crystalline silicon substrate.

12. The method according to claim 9, wherein the forming of the silicon oxide thin film by the thermally activated dry oxidation operation includes a treatment selected from the group consisting of:
   applying to said surface of the crystalline silicon substrate a temperature higher than the ambient temperature and using an oxidizing agent in a gaseous form or contained in a plasma;
   applying to said surface of the crystalline silicon substrate an ultraviolet radiation; and
   treating said surface of the crystalline silicon substrate with a plasma treatment activated by microwaves, radio-frequencies, or ultra-high frequencies.

13. The method according to claim 9, wherein the operation of removing said silicon oxide thin film is carried out by a method selected from the group consisting of a dry method, a wet method, and a method comprising a treatment in a reducing medium.

14. The method according to claim 9, wherein the two successive operations constitute an operational cycle repeated at least once during the isotropic etching treatment.

15. The method according to claim 9, wherein the silicon oxide thin film formed during the isotropic etching treatment has a total thickness ranging between 10 nm and 500 nm.

16. The method according to claim 9, wherein forming the photovoltaic cell comprises at least partly covering said surface of the crystalline silicon substrate with a multi-layer stack, said stack including, in succession:
- a passivation layer;
- a thin layer of amorphous or microcrystalline silicon with a predetermined doping type;
- an electrode; and
- and a current collector.

17. The method according to claim 9, wherein the doping type of the thin layer of amorphous or microcrystalline silicon is opposite to the doping type of the crystalline silicon substrate.

18. The method according to claim 9, wherein the doping type of the thin layer of amorphous or microcrystalline silicon is identical to the doping type of the crystalline silicon substrate.

19. The method according to claim 9, wherein the passivation layer is formed by at least one thin layer of intrinsic amorphous silicon.

20. A method for producing at least one photovoltaic cell, comprising successively:
- anisotropically etching a surface of a crystalline silicon substrate;
- performing an isotropic etching treatment of said surface of the crystalline silicon substrate, said isotropic etching treatment including two successive operations, consisting of (i) forming by a thermally activated dry oxidation, on said surface of the crystalline silicon substrate, a silicon oxide thin film with a thickness ranging between 2 nm and 500 nm, and (ii) entirely removing said silicon oxide thin film, respectively; and
- forming the photovoltaic cell on said surface of the crystalline silicon substrate by at least partly covering said surface of the crystalline silicon substrate with a multi-layer stack, said multi-layer stack including, in succession:
  - a passivation layer formed by at least one thin layer of crystalline silicon oxide in direct contact with said surface of the crystalline silicon substrate;
  - a thin layer of amorphous or microcrystalline silicon with a predetermined doping type;
  - an electrode; and
  - a current collector.

21. The method according to claim 20, wherein the operation of removing said silicon oxide thin film results in smoothing of the surface of the crystal line silicon substrate surface and/or rounding off of peaks and valleys of pyramids formed on the surface of the crystalline silicon substrate.

22. The method according to claim 20, wherein the forming of the silicon oxide thin film by the thermally activated dry oxidation operation includes a treatment selected from the group consisting of:
- applying to said surface of the crystalline silicon substrate a temperature higher than the ambient temperature and using an oxidizing agent in a gaseous form or contained in a plasma;
- applying to said surface of the crystalline silicon substrate an ultraviolet radiation; and
- treating said surface of the crystalline silicon substrate with a plasma treatment activated by microwaves, radio-frequencies, or ultra-high frequencies.

23. The method according to claim 20, wherein the operation of removing said silicon oxide thin film is carried out by a method selected from the group consisting of a dry method, a wet method, and a method comprising a treatment in a reducing medium.

24. The method according to claim 20, wherein the two successive operations constitute an operational cycle repeated at least once during the isotropic etching treatment.

25. The method according to claim 20, wherein the silicon oxide thin film formed during the isotropic etching treatment has a total thickness ranging between 10 nm and 500 nm.

26. The method according to claim 20, wherein the doping type of the thin layer of amorphous or microcrystalline silicon is opposite to the doping type of the crystalline silicon substrate.

27. The method according to claim 20, wherein the doping type of the thin layer of amorphous or microcrystalline silicon is identical to the doping type of the crystalline silicon substrate.

28. The method according to claim 20, wherein the passivation layer is formed by at least one thin layer of intrinsic amorphous silicon.

* * * * *